(12) United States Patent
Hsieh et al.

(10) Patent No.: US 6,229,176 B1
(45) Date of Patent: May 8, 2001

(54) SPLIT GATE FLASH WITH STEP POLY TO IMPROVE PROGRAM SPEED

(75) Inventors: Chia-Ta Hsieh, Tainan; Yai-Fen Lin, Taichung; Hung-Cheng Sung, Hsinchu; Chuang-Ke Yeh, Hsin-Chu; Di-Son Kuo, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/257,833

(22) Filed: Feb. 25, 1999

Related U.S. Application Data

(62) Division of application No. 09/115,719, filed on Jul. 15, 1998, now Pat. No. 5,879,992.

(51) Int. Cl.[7] .................................................. H01L 29/76
(52) U.S. Cl. ........................ 257/316; 257/314; 257/315; 257/317; 257/320; 257/321; 257/323; 257/324; 257/325; 257/638
(58) Field of Search .................................. 257/314–317, 257/320, 321, 323, 324, 325, 638

(56) References Cited

U.S. PATENT DOCUMENTS 4,994,873 * 2/1991 Madan ................................. 357/23.5
5,067,108   11/1991 Jeng ...................................... 365/185
5,422,292    6/1995 Hong et al. ............................. 437/43
5,614,747    3/1997 Ahn et al. .............................. 257/316
5,652,161    7/1997 Ahn ......................................... 437/43
5,703,388 * 12/1997 Wang et al. ........................... 257/315
5,969,383 * 10/1999 Chang et al. .......................... 257/316
6,031,264 *  2/2000 Chien et al. ........................... 257/315

* cited by examiner

Primary Examiner—Eddie C. Lee
Assistant Examiner—Matthew E. Warren
(74) Attorney, Agent, or Firm—George O. Saile; Stephen B. Ackerman; Sevgin Oktay

(57) ABSTRACT

A method is provided for forming a split-gate flash memory cell having a step poly supporting an interpoly oxide of varying thickness for the purposes of improving the over-all performance of the cell. Polyoxide is formed over portions of a first polysilicon layer which in turn is partially etched to form a step adjacent to the side-wall of a floating gate underlying the polyoxide. A spacer is next formed of a hot temperature oxide over the step poly. An interpoly oxynitride is then formed and control gate is patterned overlapping the floating gate with the intervening interpoly oxide. The step poly and the spacer thereon form proper distances between the control gate and the floating gate while keeping the distance between the poly tip and the control gate unchanged so that appropriate couplings between the control gate and the floating gate, and between the floating gate and the substrate are achieved, thus improving the over-all performance of the split-gate flash memory having a step poly.

8 Claims, 3 Drawing Sheets

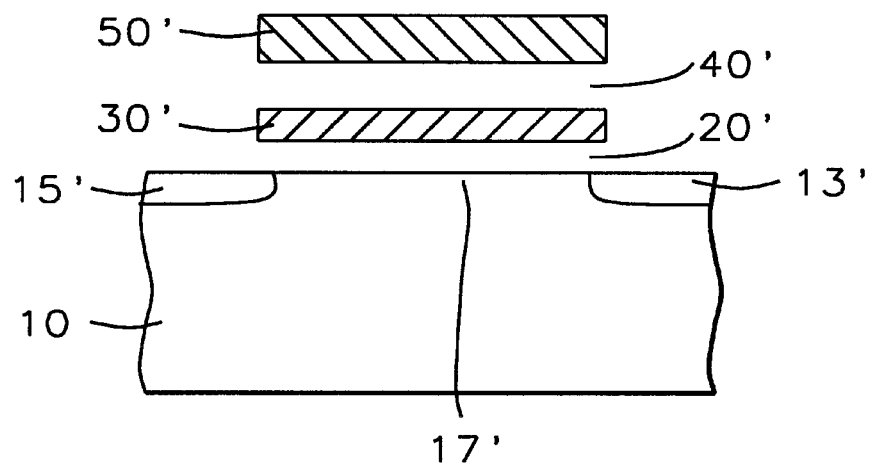
FIG. 1a – Prior Art
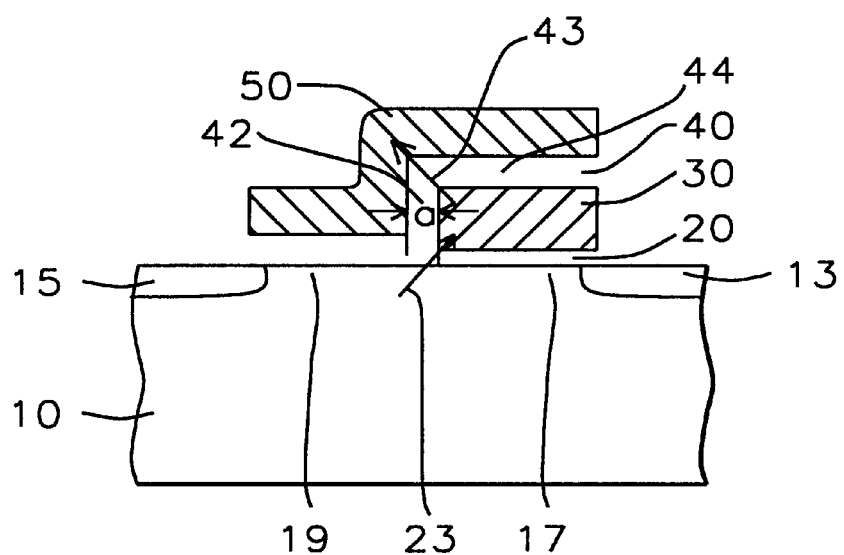
FIG. 1b – Prior Art

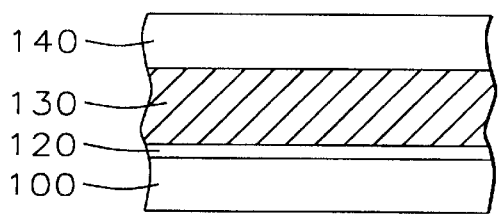
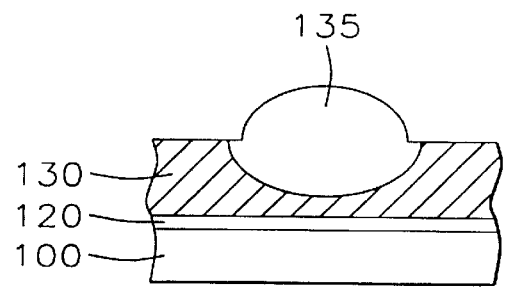
FIG. 2a  FIG. 2d
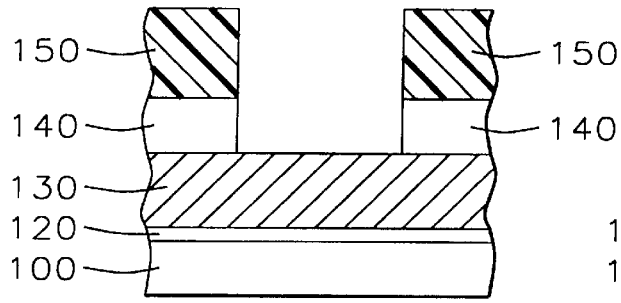
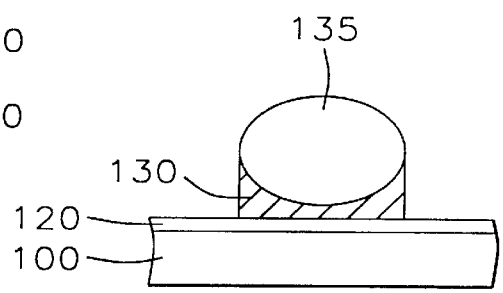
FIG. 2b  FIG. 2e
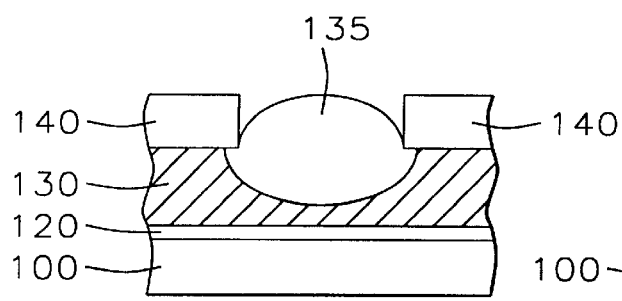
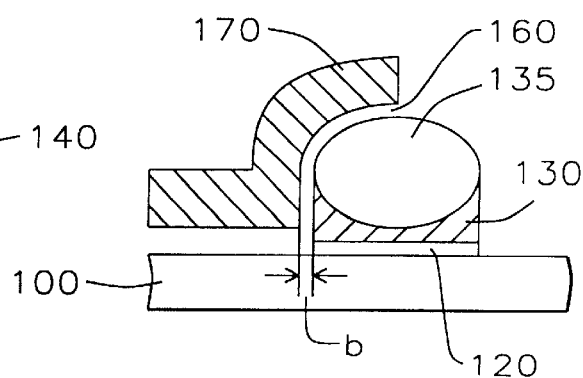
FIG. 2c  FIG. 2f

SPLIT GATE FLASH WITH STEP POLY TO IMPROVE PROGRAM SPEED

This is a division of patent application Ser. No. 09/115,719, filing date Jul. 15, 1998, now U.S. Pat. No. 5,879,992. A Method Of Fabricating Step Poly To Improve Program Speed In Split Gate Flash, assigned to the same assignee as the present invention.

BACKGROUND OF THE INVENTION

1. Field of the Invention

The present invention relates to the manufacturing of semiconductor memories, and in particular, to forming split-gate flash memories with improved program speed.

2. Description of the Related Art

Programmability and erasability are important aspects of electrically alterable memory devices as they are well known in the art. The speed of programming and erasing a memory device are governed by the thickness of the tunneling oxide between the substrate and the floating gate and the interpoly oxide between the floating gate and the control gate. At the same time, the thickness of the oxides determine the ease of manufacturability and reliability of semiconductor memories. It is disclosed in the present invention a method of improving the program speed by modifying the thickness of the intergate oxide while at the same time preserving the reliability of the memory device.

In prior art, the importance of program speed and the associated coupling between the floating gate and the source, and between the floating gate and the control gate of a memory cell has been well recognized since the advent of the one-transistor cell memory cell with one capacitor. Over the years, many variations of this simple cell have been advanced for the purposes of shrinking the size of the cell and, at the same time, improve its performance. The variations consist of different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMs). Generally, flash EEPROM cells having both functions of electrical programming and erasing may be classified into two categories, namely, a stack-gate structure and a split-gate structure. A conventional stack-gate type cell is shown in FIG. 1a where, as is well known, tunnel oxide film (20'), a floating gate (30'), an interpoly insulating film (40') and a control gate (50') are sequentially stacked on a silicon substrate (10) between a drain region (13') and a source region (15') separated by channel region (17'). Substrate (10) and channel region (17') are of a first conductivity type, and the first (13') and second (15') doped regions are of a second conductivity type that is opposite the first conductivity type.

One of the problems that is encountered in flash memory of FIG. 1a is the "over-erasure" of the cell contents during erasure operations. In FIG. 1a, the stacked-gate transistor is capable of injecting electrons from drain (13), based on a phenomenon known as the Fowler-Nordheim Tunneling Effect, through tunneling oxide layer (20') into floating gate (30'). The threshold voltage of a stacked-gate transistor can be raised by means of such electron injection, and the device is then assumes a first state that reflect the content of the memory cell. On the other hand, during erasure of the memory cell, electrons are expelled from the source (15') through tunneling oxide layer (20') and out of floating gate (30') of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e., more electrons than were previously injected. This results in the formation of electron holes in the floating gate of the device. In severe cases, the stacked-gate transistor becomes a depletion transistor, which conducts even in the absence of the application of a control voltage at the control gate, (50). This phenomenon is known in the art as memory over-erasure.

To overcome the described memory over-erasure problem of stacked-gate type EEPROM devices, a split-gate EEPROM device is used as shown in FIG. 1b. This memory device comprises floating-gate transistor which similarly includes control gate (50), floating gate (30) with an intervening interpoly oxide (40) as in the case of the stacked-gate transistor of FIG. 1a. However, floating gate (30) here covers only a portion of the channel region, (17), and the rest of the channel region, (19'), is directly controlled by control gate (50). This split-gate-based memory cell is equivalent to a series connected floating-gate transistor (17) and an enhanced isolation transistor (19'), as is schematically represented in FIG. 1b. The principal advantage of such configuration is that isolation transistor (19') is free from influence of the state of floating gate (17) and remains in its off-state, even if floating-gate transistor (17) is subjected to the phenomenon of over-erasure and therefore, is in a conductive state. The memory cell can thus maintain its correct state irrespective of the over-erasure problem.

To program the transistor shown in FIG. 1b, charge is transferred from substrate (10) through gate oxide (20) and is stored on floating gate (30) of the transistor. The amount of charge is set to one of two levels to indicate whether the cell has been programmed "on" of "off." "Reading" of the cell's state is accomplished by applying appropriate voltages to the cell source (15) and drain (13), and to control gate (50), and then sensing the amount of charge on floating gate (30). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim (F-N) tunneling mentioned above. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of (F-N) tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Usually a thickness of between about 80 to 120 Angstroms is required to facilitate F-N tunneling.

The thicknesses of the various portions of the oxide layers on the split-gate side (between the control gate and the source) and the stacked-side (between the floating gate and the drain) of the memory cell of FIG. 1b play an important role in determining such parameters as coupling ratio and the memory erase-write speed. In prior art, various methods have been developed to address these parameters. For example, in U.S. Pat. No. 5,067,108, Jeng discloses a single transistor electrically programmable and erasable memory cell having a re-crystallized floating gate disposed over a first-insulating layer and extending over a portion of the channel region and over a portion of the drain regions to maximize capacitive coupling therebetween. A second insulating layer has a top wall portion over the floating gate and a side wall portion immediately adjacent to the floating gate and has a thickness which permits Fowler-Nordheim tunneling of charges therethrough. An electrically conductive control gate has two electrically connections sections: A first section is over the first insulating layer and is immediately adjacent to the side-wall portion of the second insulating layer. The first section extends over a portion of the channel region and over the source region. A second section is disposed over the top wall portion of the second insulating layer to minimize capacitive coupling with the floating gate.

Ahn of U.S. Pat. No. 5,652,161 also uses a thick insulation film between the tunneling region and the channel region in an EEPROM split-gate flash memory cell in order to prevent the degradation of the tunnel oxide film due to the band-to-band tunneling and the secondary hot carriers which are generated by a high electric field formed at the overlap regions between the junction region and the gate electrode when programming and erasure operations are performed with high voltage.

Hong, et al., in U.S. Pat. No. 5,422,292 show the forming of an intergate poly between the floating gate and the control gate by using two oxide layers in order to improve the isolation between the two gates and thereby prevent leakage. In a separate U.S. Pat. No. , 5,614,747, Ahn, et al., disclose still another method of manufacturing a flash EEPROM cell where over-erasure of a flash EEPROM cell can be prevented and at the same time, the cell area decreased by forming a floating gate in the form of a spacer on a side-wall of a select gate and by forming a control gate to surround the select gate and the floating gate.

In general, prior art makes a trade-off between program speed and erase speed in choosing the various tunnel oxide thicknesses in a memory cell. What is disclosed in the present invention is a method of forming split-gate flash memory cell where program speed can be improved without having to trade-off erase speed.

SUMMARY OF THE INVENTION

It is therefore an object of this invention to provide method of forming a step poly to improve program speed in split-gate flash memory.

It is another object of this invention to provide a method of forming an interpoly oxide of varying thickness supported by a step poly for the purposes of improving the over-all performance of the cell.

It is yet another object of this invention to provide a method for appropriate coupling between the control gate and the floating gate, and between the floating gate and the substrate are achieved, thus improving the over-all performance of the split-gate flash memory having a step poly.

It is still another object of the present invention to provide a split-gate flash memory cell having a step poly supporting an interpoly oxide of varying thickness for the purposes of improving the over-all performance of the cell.

These objects are accomplished by providing a silicon substrate having a plurality of active and field regions defined; forming a tunnel oxide layer over said substrate; forming a first polysilicon layer over said tunnel oxide layer; forming a layer of nitride over said tunnel oxide layer; forming and patterning a first photoresist layer to form a photoresist mask with a pattern corresponding to the floating gate of said split-gate flash memory cell; etching said layer of nitride through said photoresist mask to form openings in said layer of nitride and to expose portions of said first polysilicon layer corresponding to said floating gate pattern; removing said first photoresist layer; oxidizing portions of said first polysilicon layer exposed in said openings in said layer of nitride to form polyoxide; removing said layer of nitride; using said polyoxide as a hard mask to etch portions of said first polysilicon layer not covered by said polyoxide hard mask to form floating gate with a step underlying said polyoxide; forming a layer of hot thermal oxide (HTO) over said substrate conformally covering said polyoxide overlying said floating gate; forming HTO spacer on sidewall of said floating gate; using said polyoxide and HTO spacer as mask, etching further said first polysilicon layer and said tunnel oxide; forming a layer of interpoly oxide over said substrate conformally covering said polyoxide overlying said floating gate; depositing a second polysilicon layer over said interpoly oxide; and patterning said second polysilicon layer with a second photoresist mask having control gate pattern to form a control gate to complete the forming of said split-gate flash memory cell with said step poly to improve program speed of said memory.

These objects are further accomplished by providing a split-gate flash memory comprising a floating gate overlying but separated from said substrate by tunnel oxide; a polyoxide layer overlying said floating gate; a step poly on the sidewall of said floating gate; a spacer supported integrally by said step poly; an interpoly oxide of varying thickness, and a control gate disposed over said floating gate and said step poly with interpoly oxide therebetween, and overlapping channel area adjacent to the channel in said active region of said substrate.

BRIEF DESCRIPTION OF THE DRAWINGS

FIGS. 1a–1b are cross-sectional views of a portion of a semiconductor substrate showing the steps of forming a split-gate flash memory cell according to prior art.

FIG. 2a is a cross-sectional view of a portion of a semiconductor substrate showing the forming of tunnel oxide, first polysilicon layer and a layer of nitride thereon according to this invention.

FIG. 2b is a cross-sectional view of a portion of a semiconductor substrate showing the patterning of the nitride layer of FIG. 2a with a photoresist mask, according to this invention.

FIG. 2c is a cross-sectional view of a portion of a semiconductor substrate showing the forming of the polyoxide in the patterned openings of FIG. 2b, according to this invention.

FIG. 2d is a cross-sectional view of a portion of a semiconductor substrate showing the removal of the nitride layer of FIG. 2c, according to this invention.

FIG. 2e is a cross-sectional view of a portion of a semiconductor substrate showing the forming of the floating gate by using the polyoxide of FIG. 2d as a hard mask, according to this invention.

FIG. 2f is a cross-sectional view of a portion of a semiconductor substrate showing the completion of the split-gate flash memory cell with uniform interpoly thickness of this invention.

DESCRIPTION OF THE PREFERRED EMBODIMENTS

Figures 2G, 2H:
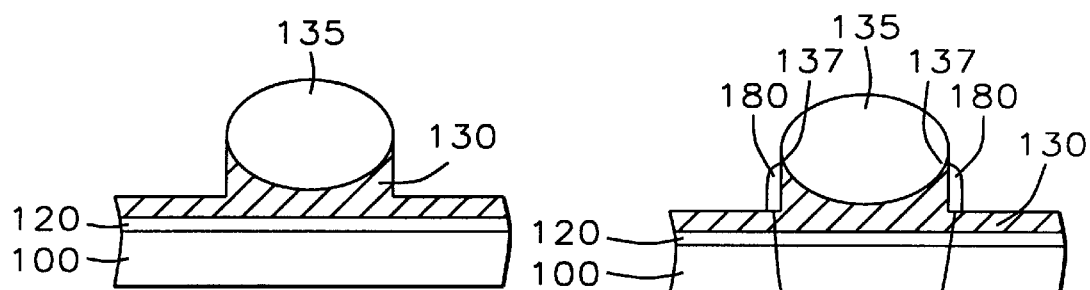
FIG. 2g is a cross-sectional view of a portion of a semiconductor substrate showing the preferred partial etching of the first polysilicon layer and forming of the floating gate by using the polyoxide of FIG. 2d as a hard mask, according to this invention.
FIG. 2h is a cross-sectional view of a portion of a semiconductor substrate showing the forming of an oxide spacer over the step poly of FIG. 2g, according to this invention.

Referring now to the drawings, in particular to FIGS. 2a–2j, there are shown schematically steps of forming a split-gate flash memory cell having a step poly on the side-wall of the floating gate of the cell in order to enhance the program speed of the memory device. The step poly is used to alter the thickness of the tunneling oxide about the floating gate without affecting the thickness of the tunneling oxide between the floating gate and the substrate.

The step poly supports an oxide spacer, where spacers are generally known in the art, but not used in altering the space between a floating gate and control gate. This is seen in the prior art FIG. 1b, where the interpoly thickness (a) is uniform. That is, side-wall (42) and top-wall (44) that together constitute the interpoly oxide (40) adjacent (a) may be varied in order to affect the rate of charge transfer between the floating gate and the control gate, but uniformly along the length of the sidewall (42). Thus, if dimension (a) is made thinner in order to increase the erase speed, represented by reference numeral (43), then this results in a decrease in the program speed, represented by reference numeral (23) in FIG. 1b, and vice versa. In other words, a trade-off must be made between the program speed and the erase speed when using conventional methods of varying the thickness (a) of FIG. 1b.

It is disclosed below in the embodiment of this invention a method of varying the interpoly thickness nonuniformly along the side-wall of the floating gate such that the interpoly is thinner at the bottom of the floating polygate, thus increasing the program speed, while not affecting the thickness at the tip of the floating polygate so as to not also affect the erase speed, thus, without introducing any trade-off. It will be known to those skilled in the art that the disclosed method makes it possible to decrease the coupling ratio of the word line of control gate to the floating gate, while at the same time increasing the coupling ratio of the source, region (15) in FIG. 1b, to the floating gate. This is better shown in the disclosed embodiment depicted in FIG. 2j where analogous to FIG. 1b, device source (113) is separated from drain (111) by channel portion (115) under floating gate (130) and portion (117) adjacent the source under control gate (170).

Figure 2I:
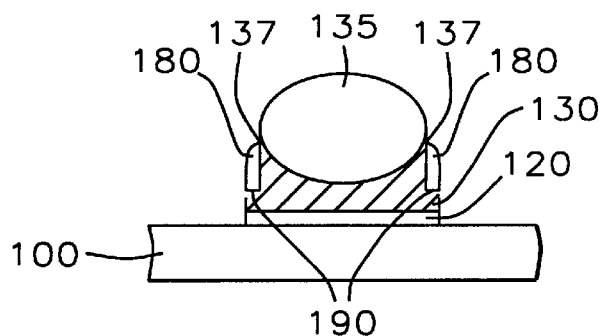
FIG. 2i is a cross-sectional view of a portion of a semiconductor substrate showing the etching of the remaining first polysilicon layer and the tunneling gate oxide according to this invention.
Figure 2J:
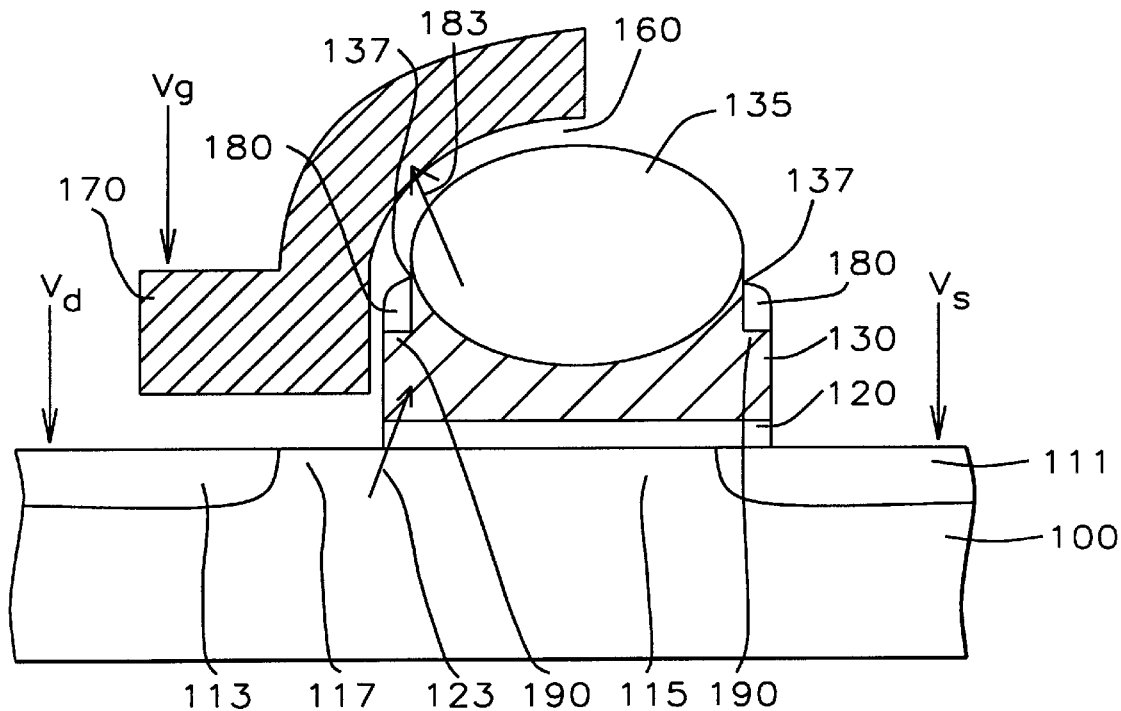
FIG. 2j is a cross-sectional view of a portion of a semiconductor substrate showing the completion of the split-gate flash memory cell with the preferred non-uniform interpoly thickness supported by the step poly of this invention.

FIGS. 2a–2i show the process steps involved in arriving at the preferred split-gate of this invention with the step poly, reference numeral (190), a main feature, shown in FIG. 2j.

In FIG. 2a, substrate (100), preferably silicon, is provided with active device regions, and passive field regions already defined (not shown) as is well known in the art. As shown in FIG. 2a, a tunnel oxide layer, (120), is first formed on substrate (100). Tunnel oxide (120) can be formed by thermal oxidation process at a temperature between about 800° C. to 900° C. Alternatively, the tunnel oxide can be formed by an atmospheric or low pressure chemical vapor deposition (LPCVD) process as is well known. Tunnel oxide layer (120) has a thickness between about 80 to 90 angstroms (Å)

A first polysilicon layer (130) is next deposited over the tunnel oxide through reduction of $SiH_4$ using LPCVD at a temperature between about 600 to 650° C. The preferred thickness of the first layer of polysilicon is between about 1100 to 1300 Å. This is followed by the forming of a layer of nitride (140) by reacting dichlorosilane ($SiCl_2H_2$) with ammonia ($NH_3$) in an LPCVD at a temperature between about 750 to 830° C.

At the next step, using conventional techniques, a first photoresist layer (150) is spun over the nitride layer to form a photoresist mask having patterns corresponding to areas where floating gates are to be defined. The patterns are then etched into the nitride layer forming openings where the underlying polysilicon layer is exposed, as shown in FIG. 2b. The etching is accomplished using a recipe comprising gases Ar, $CHF_3$, $CF_4$ at flow rates between about 700 to 1000, 5 to 20 and 50 to 100 sccm, respectively. Afterwards, the photoresist mask is removed using oxygen plasma ashing as is done conventionally.

The portions of the underlying polysilicon layer exposed in the patterned openings of the nitride layer are next oxidized using a wet process comprising water or wet $O_2$. It is preferred that the polysilicon is doped prior to the oxidation inasmuch as doped polysilicon, with phosphorous, for example, oxidizes more rapidly than undoped polysilicon. The resulting oxidation produces polyoxide 135 as shown in FIG. 2c. The preferred thickness of the polyoxide is between about 1400 to 1600 Å. Once the polyoxide has been formed, the nitride layer is removed by etching with a wet solution of phosphoric acid, $H_3PO_4$ as shown in FIG. 2d. The polyoxide so formed is now used as a hard mask to etch the remaining portions of the first polysilicon layer not covered by the polyoxide mask as shown in FIG. 2e. This is accomplished by using an etch recipe comprising gases HBr and $Cl_2$. The polysilicon layer protected under the polyoxide forms the floating gate of this invention which is separated from the substrate by the tunnel oxide layer (120) as seen in FIG. 2e.

Normally, the poly etch is used to remove all of the remaining first polysilicon layer until the underlying gate oxide, or tunnel oxide layer (120) is reached, as shown in FIG. 2e. Subsequently, an interpoly oxide layer (160) is formed followed by the depositing and patterning of a second polysilicon layer—with a second photoresist mask (not shown)—to form control gate (170), shown in FIG. 2f. It will be noted in FIG. 2f that the interpoly layer (160) forms a uniform thickness (b) from the tip, (137), to the base of the floating gate, (130). Hence, the uniform thickness (b) will only benefit either the program speed or the erase speed, but not both, of the memory cell as explained before. It is a main feature and key aspect of the present invention to be able to vary the thickness of the interpoly oxide in accordance with the requirements for improved performance, both in terms of program speed and erase speed as described in the embodiments below.

An important aspect of the present invention is to, first, perform only a partial etch of the first polysilicon layer as shown in FIG. 2g. It is preferred that the partial poly etch be performed to a depth ranging from about a one-half the thickness of the polysilicon to about two-thirds. The etch is accomplished with a recipe comprising gases HBr and $Cl_2$. Then, a layer of hot temperature oxide (HTO) is deposited over the substrate covering (not shown) the polyoxide features and the first polysilicon layer. It is preferred that the HTO is formed by an LPCVD process in which dichlorosilane and nitrous oxide are reacted at a temperature between about 900° C. to 1000° C. Subsequently, the HTO is anisotropically etched whereby spacers (180) are formed as shown in FIG. 2h. Anisotropic etching is known in the art. It will be noted that spacers (180) are formed over a step poly (190), which is the main feature of the present invention. The step poly, (190), is distinctly formed further at the next poly etch step where the remaining first polysilicon layer is removed, as seen in FIG. 2i, by using a recipe comprising gases HBr and $Cl_2$.

The significance of the step poly will be appreciated by those skilled in the art in that when a control gate is formed overlapping the floating gate—with an intervening interpoly oxide—the step poly supports a relatively thick oxide at the tip (137) of the floating gate oxide (FIG. 2j), while at the same time, providing a thin oxide at the base of the floating gate. The interpoly oxide is preferably an oxynitride film formed by the nitridization of a thermal oxide layer by thermally annealing the oxide layer with dilute $NH_3$ using $N_2$ or Ar as a carrier gas at a temperature between about 850 to 950° C. A second polysilicon layer is deposited over the oxynitride layer and patterned to form the control gate, (170), as shown in the same FIG. 2j. It is preferred that the second layer of polysilicon is formed using silicon source $SiH_4$ in an LPCVD chamber at a temperature between about 550 to 650° C., and that it has a thickness between about 1000 to 2000 Å.

Thus, the step poly (190) of this invention along with the spacer (180) formed integrally with the interpoly oxide together form a structure where the apex portion of the spacer converges vanishingly with the upper tip (137) of the floating gate, while the base is supported by the step poly. The base of the spacer has a width between about 100 to 300 Å. At the tip (137), the interpoly oxide has a full thickness because of the vanishing spacer at that point, while below the step poly (180), the interpoly oxide is thinner by the width of the spacer, that is, of the step poly. Hence, the oxide so formed near the tip (137) enables the memory cell to erase at a faster speed, as referenced by (183), due to smaller coupling ratio, and the thinner oxide at the base of the floating gate enables a faster program speed, as referenced by (123). In other words, appropriate couplings between the control gate and the floating gate, and between the floating gate and the substrate are achieved, thus improving the over-all performance of the split-gate flash memory having a step poly.

Though these numerous details of the disclosed method are set forth here, such as process and device parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, for forming step poly of different dimensions commensurate with desired coupling ratios between the floating gate and the control gate, and between the floating gate and the substrate.

That is to say, while the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell with a poly comprising:

a substrate having active and field regions defined;

said active region having a source and a drain region separated by a channel area;

a floating gate overlying but separated from said substrate by tunnel oxide;

a polyoxide layer overlying said floating gate;

a step poly on the sidewall of said floating gate;

said step poly having a depth between about one-half to two-thirds of the thickness of said floating gate;

a spacer supported integrally by said step poly;

an interpoly oxide of varying thickness, and a control gate disposed over said floating gate and said step poly with interpoly oxide therebetween, and overlapping a portion of said channel area adjacent to said source region.

2. The split-gate memory cell of claim 1, wherein said floating gate has a thickness between about 1100 to 1300 Å.

3. The split-gate memory cell of claim 1, wherein said polyoxide has a thickness between about 1400 to 1600 Å.

4. The split-gate memory cell of claim 1, wherein said step poly has a thickness between about 500 to 900 Å.

5. The split-gate memory cell of claim 1, wherein said spacer has an apex portion and a base portion.

6. The split-gate memory cell of claim 5, wherein said apex portion of said spacer vanishingly converges with an upper tip of said floating gate.

7. The split-gate memory cell of claim 5, wherein said base portion of said spacer integrally joins with said step poly.

8. The split-gate memory cell of claim 7, wherein said base portion of said spacer has the same dimension as that of said step poly.

* * * * *